United States Patent
Chen et al.

(10) Patent No.: US 12,382,611 B2
(45) Date of Patent: Aug. 5, 2025

(54) MODULAR LIQUID COOLING FOR MULTI-NODE COMPUTING SYSTEMS

(71) Applicant: Quanta Computer Inc., Taoyuan (TW)

(72) Inventors: Chao-Jung Chen, Taoyuan (TW); Chih-Wei Lin, Taoyuan (TW); Che-Hung Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 245 days.

(21) Appl. No.: 18/350,173

(22) Filed: Jul. 11, 2023

(65) Prior Publication Data
US 2024/0389276 A1    Nov. 21, 2024

Related U.S. Application Data

(60) Provisional application No. 63/502,805, filed on May 17, 2023.

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/1492* (2013.01); *H05K 7/20254* (2013.01)

(58) Field of Classification Search
CPC ............. H05K 7/20781; H05K 7/1489; H05K 7/1492; H05K 7/20254; H05K 7/20772
See application file for complete search history.

(56) References Cited

U.S. PATENT DOCUMENTS

| | | | | |
|---|---|---|---|---|
| 7,957,132 B2* | 6/2011 | Fried | ................... | F28D 15/0266 361/694 |
| 9,414,523 B2* | 8/2016 | Chainer | ............. | H05K 7/20772 |
| 11,683,910 B2* | 6/2023 | Chen | ................... | H05K 7/20272 361/679.46 |
| 11,832,417 B2* | 11/2023 | Chen | ................... | H05K 7/20772 |

(Continued)

FOREIGN PATENT DOCUMENTS

| CN | 101779178 A | 7/2010 |
|---|---|---|
| CN | 102791107 A | 11/2012 |

OTHER PUBLICATIONS

TW Office Action for Application No. 112133803, mailed Jan. 10, 2024, w/ First Office Action Summary.

(Continued)

*Primary Examiner* — Lisa Lea-Edmonds
(74) *Attorney, Agent, or Firm* — NIXON PEABODY LLP

(57) ABSTRACT

A computing system includes a chassis, a water circulation network coupled to the chassis, a power distribution network coupled to the chassis, and one or more sleds removably coupled to the chassis. The water circulation network includes a cold water distribution network and a hot water collection network. Each sled of the one or more sleds includes a corresponding cold plate. Each sled is configured to slide along the chassis in two slide directions including a slide-close direction to reach a closed position and a slide-open direction to vacate the closed position. When in the closed position, each sled is configured to (a) bridge the hot water collection network and the cold water distribution network via the corresponding cold plate and (b) couple to the power distribution network.

20 Claims, 9 Drawing Sheets

(56) References Cited

U.S. PATENT DOCUMENTS

| | | | | |
|---|---|---|---|---|
| 11,839,041 | B1* | 12/2023 | Tsorng | H05K 5/023 |
| 11,963,338 | B2* | 4/2024 | Edmunds | H05K 7/20772 |
| 12,096,595 | B2* | 9/2024 | Cushen | H05K 7/20272 |
| 12,178,009 | B2* | 12/2024 | Liu | H05K 7/20254 |
| 12,185,496 | B2* | 12/2024 | Coxe, III | H05K 7/20254 |
| 2022/0201896 | A1* | 6/2022 | Edmunds | H05K 7/20254 |
| 2023/0413474 | A1* | 12/2023 | Clark | H05K 7/20772 |
| 2024/0032240 | A1* | 1/2024 | Doglio | H05K 7/20272 |
| 2024/0130088 | A1* | 4/2024 | Cheng | H05K 7/20781 |
| 2024/0196565 | A1* | 6/2024 | Chen | H05K 7/20772 |
| 2024/0385663 | A1* | 11/2024 | Chen | H05K 7/20781 |
| 2024/0389276 | A1* | 11/2024 | Chen | H05K 7/20781 |
| 2025/0040101 | A1* | 1/2025 | Chen | H05K 7/20236 |

OTHER PUBLICATIONS

TW Search Report for Application No. 112133803, mailed Jan. 10, 2024, w/ First Office Action.

* cited by examiner

MODULAR LIQUID COOLING FOR MULTI-NODE COMPUTING SYSTEMS

CROSS-REFERENCE TO RELATED APPLICATIONS

This application claims priority from and benefit of U.S. Provisional Patent Application Ser. No. 63/502,805, filed on May 17, 2023, titled "Liquid Cooling Design on Multi-Node Server," which is hereby incorporated by reference herein in its entirety.

FIELD OF THE INVENTION

The present invention relates generally to heat management in computing systems, and more specifically, to a modular liquid cooling system in a multi-node computing system that provides for ease of access to individual nodes in the multi-node computing system.

BACKGROUND OF THE INVENTION

Computing systems typically have electronic components housed in a chassis. Examples of computing systems include desktop computers, blade servers, rack-mount servers, etc. Computing systems generally generate heat in typical operation, therefore, heat management is employed. Heat management can be localized to some components and/or globalized to air surrounding all components within the computing system. Localized heat management is focused on specific hardware components of computing systems that generate heat, for example, processors, mechanical disks, power supplies, etc. Globalized heat management involves reducing ambient temperature within the chassis, for example, by expelling warmer air from within the chassis to the environment and drawing in cooler air from the environment into the chassis.

The goal of heat management is to cool electronic components of computing systems so that these components do not operate outside their respective ratings and/or do not become damage due to excessive heating. Cooling electronic components allows computing systems to operate at peak efficiency. Heat sinks, fans, liquid cooling systems with heat exchangers, etc., are used in cooling specific electronic components. Components like processors, when liquid cooled, can be difficult to replace in the field. These components typically are contacted with cold plates that should first be removed in order to gain physical access to the components. In a multi-node computing system that includes multiple independent and interdependent nodes, gaining access physical access to components on a first node can disturb operations on a second node that should be unaffected. The present disclosure provides solutions that at least reduces or mitigates any downtime that can be attributed with gaining physical access to one or more nodes of multi-node computing systems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a chassis, a water circulation network coupled to the chassis, a power distribution network coupled to the chassis, and one or more sleds removably coupled to the chassis. The water circulation network includes a cold water distribution network and a hot water collection network. Each sled of the one or more sleds includes a corresponding cold plate. Each sled is configured to slide along the chassis in two slide directions including a slide-close direction to reach a closed position and a slide-open direction to vacate the closed position. When in the closed position, each sled is configured to (a) bridge the hot water collection network and the cold water distribution network via the corresponding cold plate and (b) couple to the power distribution network.

In an implementation, each sled of the one or more sleds houses a computing node. In an implementation, a first sled of the one or more sleds includes a first cold plate and a first power distribution board. When the first sled is at the closed position, the first cold plate is coupled to the water circulation network to bridge the cold water distribution network and the hot water collection network at the first cold plate, and the first power distribution board is coupled to the power distribution network. In an implementation, a second sled of the one or more sleds includes a second cold plate and a second power distribution board. When the second sled is at the closed position, the second cold plate is coupled to the water circulation network to bridge the cold water distribution network and the hot water collection network at the second cold plate, and the second power distribution board is coupled to the power distribution network. In an implementation, the first sled includes a first sled floor having multiple portions including an upper first sled floor portion and a lower first sled floor portion. A width of the upper first sled floor portion is less than a width of the lower first sled floor portion. In an implementation, the first power distribution board is coupled to the lower first floor portion and the first cold plate is coupled to the upper first floor portion.

In an implementation, each sled of the one or more sleds further includes a sled cold water pipe network and a sled hot water pipe network. A first end of the sled cold water pipe is directly coupled to the corresponding cold plate, and a second end of the sled cold water pipe is coupled to the cold water distribution network. A first end of the sled hot water pipe directly coupled to the corresponding cold plate, and a second end of the sled hot water pipe is coupled to the hot water collection network. In an implementation, each sled of the one or more sleds further includes a sled power routing cable and a power distribution board. The power distribution board is coupled to the sled power routing cable, and when in the closed position, the sled power routing cable is coupled to the power distribution network.

In an implementation, the one or more sleds includes at least a first sled and a second sled. Electronic components of the first sled are communicatively coupled to electronic components of the second sled when both the first sled and the second sled are in the closed position. In an implementation, the one or more sleds is at least two sleds, and the power distribution network is routed in spaces between two adjacent sleds of the at least two sleds. In an implementation, the one or more sleds is at least two sleds, the cold water distribution network includes multiple chassis cold water pipe sections, and at least one of the chassis cold water pipe sections is routed in a space between two adjacent sleds of the at least two sleds. In an implementation, the cold water distribution network includes multiple chassis cold water pipe sections, and at least one of the chassis cold water pipe sections is routed in a space between a first sidewall of the chassis and the one or more sleds. In an implementation, the hot water collection network includes multiple chassis hot water pipe sections, and at least one of the chassis hot water pipe sections is routed in a space between a second sidewall of the chassis and the one or more sleds.

According to certain aspects of the present disclosure, a method for coupling cold plates of a computing system including at least two sleds to a water circulation network of the computing system is provided. A first sled of the at least two sleds is slid along a chassis of the computing system in a slide-close direction to place the first sled in a closed position. A first cold plate of the first sled is attached to the water circulation network such that the first cold plate bridges a cold water distribution network of the water circulation network and a hot water collection network of the water circulation network. A first power distribution board of the first sled is attached to a power distribution network of the computing system.

In an implementation, attaching the first cold plate of the first sled to the water circulation network includes securing at least one fastener. In an implementation, a second sled of the at least two sleds is slid along a chassis of the computing system in a slide-close direction to place the second sled in a closed position. The second sled is located proximate to the first sled. A second cold plate of the second sled is attached to the water circulation network such that the second cold plate bridges the cold water distribution network of the water circulation network and the hot water collection network of the water circulation network at the second cold plate. A second power distribution board of the second sled is attached to the power distribution network of the computing system. In an implementation, electrical components of the first sled are electrically coupled to electrical components of the second sled via a cable.

According to certain aspects of the present disclosure, a method for decoupling cold plates of a computing system including at least two sleds from a water circulation network of the computing system is provided. A first cold plate of a first sled of the at least two sleds is detached from the water circulation network to remove a bridge formed between a cold water distribution network of the water circulation network and a hot water collection network of the water circulation network at the location of the first cold plate. A first power distribution board of the first sled is detached from a power distribution network of the computing system. The first sled is slid along a chassis of the computing system in a slide-open direction to displace the first sled from a closed position.

In an implementation, the detaching a first cold plate of a first sled of the at least two sleds from the water circulation network includes loosening at least one fastener. In an implementation, a cable connecting electrical components of the first sled to electrical components of a second sled is detached prior to sliding the first sled along the chassis of the computing system in the slide-open direction.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
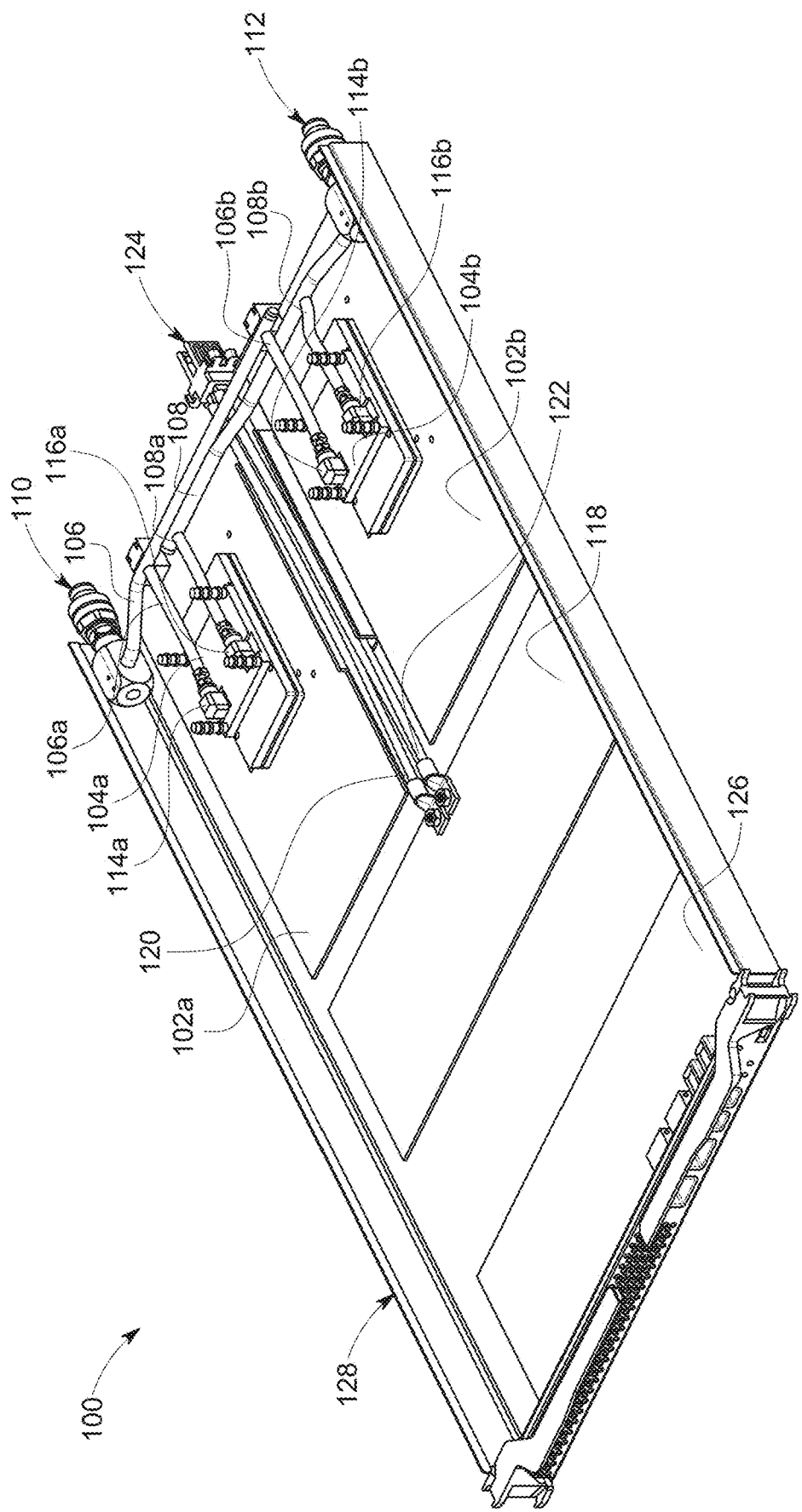
FIG. 1 is a perspective view showing a multi-node computing system in the prior art.

Liquid cooling typically involves placing a cold plate in contact with an electronic component in order to facilitate heat transfer from the electronic component to the cold plate, and from the cold plate to a liquid cooling medium. The cold plate sometimes covers the entirety of the electronic component, thus preventing easy access to the electronic component. Furthermore, the cold plate generally requires channels to facilitate the flow of the liquid cooling medium through the cold plate. In multi-node computing systems, multiple components (e.g., each of the processors for each node) can be liquid cooled. As a result, if a malfunctioning electronic component located on one node requires replacement, swapping out the malfunctioning electronic component for a new electronic component can involve taking the entire multi-node computing system offline. This is because the cold plate and any tubing connected to the cold plate will have to be removed in order to gain access to the malfunctioning electronic component.

Therefore, embodiments of the present disclosure provide a multi-node computing system with modular liquid-cooled computing nodes. The multi-node computing system includes a chassis, a water circulation network coupled to the chassis, a power distribution network coupled to the chassis, and one or more sleds corresponding to the modular liquid-cooled computing nodes. The one or more sleds are removably coupled to the chassis, and each of the one or more sleds includes a cold plate. Each sled is configured to be placed in a closed position to connect a corresponding cold plate to the water circulation network and a corresponding computing node to the power distribution network.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a multi-node computing system 100 in the prior art is provided. The multi-node computing system 100 includes two nodes, a first computing node (i.e., a first node) and a second computing node (i.e., a second node). The multi-node computing system 100 includes a chassis 128 that houses components of the multi-node computing system 100. The multi-node computing system 100 includes a first node circuit board 102a and a second computing node circuit board 102b. The first node circuit board 102a and the second node circuit board 102b can be motherboards or server boards corresponding to each node in the multi-node computing system 100. The multi-node computing system 100 further includes a power distribution board 118 and an input/output (I/O) board 126. The power distribution board 118 and the I/O board 126 are shared between the two nodes in the multi-node computing system 100. The power distribution board 118 delivers power to the different circuit boards of the multi-node computing system 100. For simplicity, electrical and power connections between boards (e.g., between the I/O board 126 and the power distribution board 118) are not shown in FIG. 1. Power routing cables 120, 122 connect to a bus bar clip 124 to provide a path for external power to flow to the power distribution board 118. The bus bar clip 124 connects to an external power source.

Each of the first node circuit board 102a and the second node circuit board 102b includes an electronic component that is liquid cooled. Cold plates 104a, 104b are provided for cooling the electronic components. The electronic components can be processors. For example, a first processor installed on the first node circuit board 102a can be cooled using the cold plate 104a, and a second processor installed on the second node circuit board 102b can be cooled using the cold plate 104b. The cold plates 104a, 104b have cold plate connectors (e.g., cold plate cold water connectors 114a, 114b and cold plate hot water connectors 116a, 116b) for connecting the cold plates 104a, 104b to a water circulation network. The cold plate cold water connectors 114a, 114b couple to cold water pipe sections 106a, 106b of a cold water pipe 106. The cold plate hot water connectors 116a, 116b couple to hot water pipe sections 108a, 108b of a hot water pipe 108. The cold water pipe 106 is provided with a cold water inlet 110, and the hot water pipe 108 is provided with a hot water outlet 112.

The water circulation network of FIG. 1 includes the cold water pipe 106, hot water pipe 108, the cold water pipe sections 106a, 106b, the hot water pipe sections 108a, 108b, the cold water inlet 110, and the hot water outlet 112. The liquid cooling system of FIG. 1 includes the water circulation network, the cold plates 104a, 104b, and couplers for connecting the cold plates 104a, 104b to the water circulation network. As provided in FIG. 1, the liquid cooling system used in the prior art is a single system designed to support two nodes. In the multi-node computing system 100, the two nodes share circuit boards (e.g., the I/O board 126 and the power distribution board 118) and power connections to the power distribution board 118 (e.g., the power routing cables 120, 122). Furthermore, when maintenance is to be performed on the first computing node including the first node circuit board 102a, the second computing node is forced to be taken offline. Thus, embodiments of the present disclosure provide a modular design of a liquid cooling system for multi-node computing systems that can greatly increase convenience for end users and/or technicians repairing or maintaining the multi-node computing system. Although described in the context of multi-node computing systems, embodiments of the present disclosure can be used in single-node computing systems that require multiple cold plates for liquid cooling.

Figure 2:
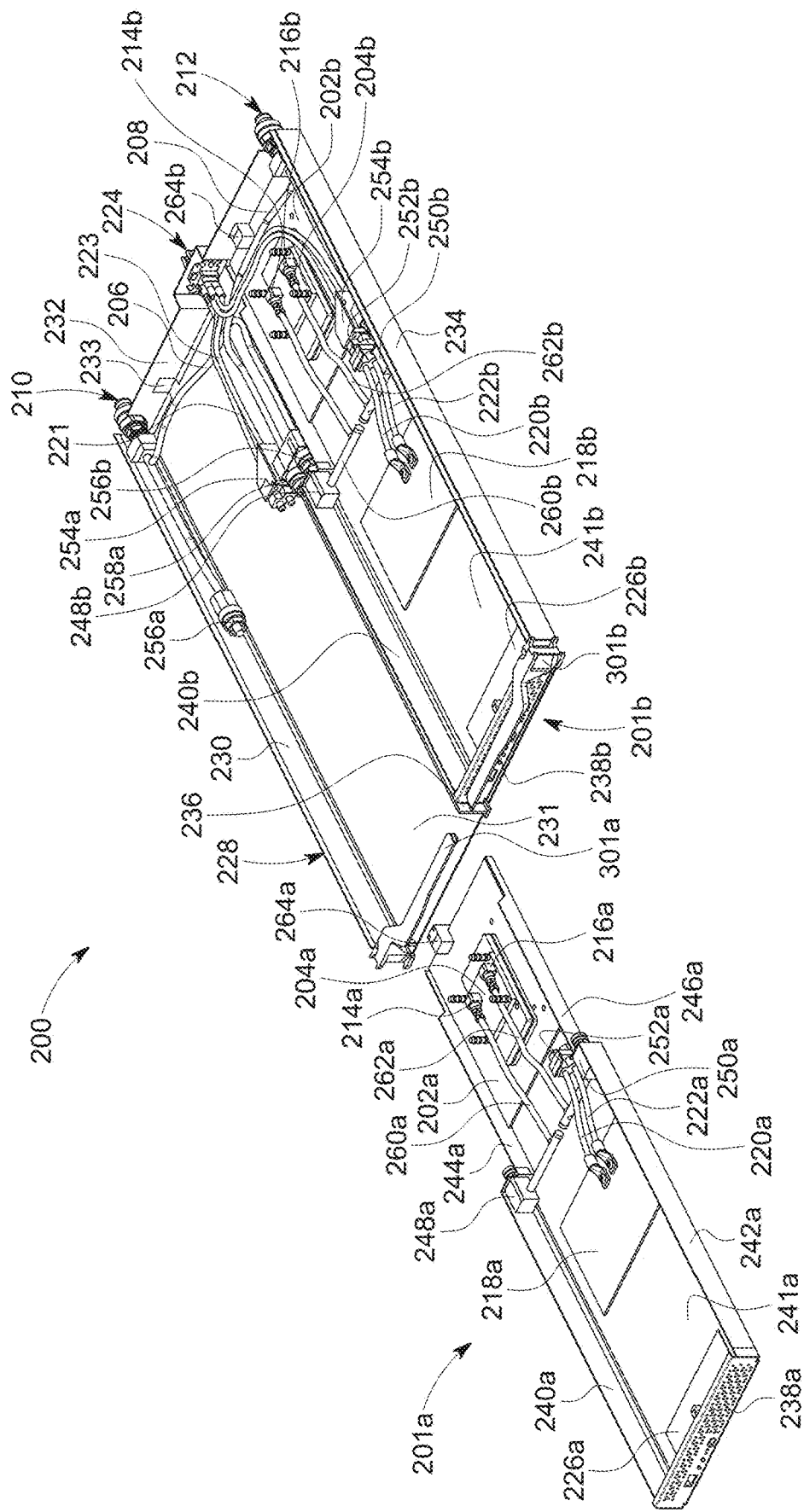
FIG. 2 is a perspective view showing a multi-node computing system, according to certain aspects of the present disclosure.

Referring to FIG. 2, a computing system 200 is provided, according to certain aspects of the present disclosure. The computing system 200 includes a chassis 228. The chassis 228 can accommodate one or more sleds (e.g., a first sled 201a and a second sled 201b). Although the example in FIG. 2 provides two sleds, the first sled 201a and the second sled 201b, computing systems can be designed to accommodate more than two sleds. For example, three, four, or five sleds arranged side-by-side can be provided in other embodiments. The chassis 228 is configured to receive the one or more sleds. The chassis 228 can include a chassis floor 231, a first chassis sidewall 230, a second chassis sidewall 234, and a third chassis sidewall 232. The third chassis sidewall 232 can include one or more openings 233 that facilitate connections to I/O ports provided by electronic components of the one or more sleds. For example, data connectors 264a, 264*b* can be accessed via the one or more openings 233. In an example, a data cable can be used to connect electronic components of the first sled 201*a* to electronic components of the second sled 201*b* using the data connectors 264*a*, 264*b*.

In some implementations, the chassis 228 further includes a separator sidewall 236 that can be shared between two adjacent sleds (e.g., the first sled 201*a* and the second sled 201*b*). The separator sidewall 236 can be parallel to the first chassis sidewall 230 and the second chassis sidewall 234. The separator sidewall 236 can have a shorter length than both the first chassis sidewall 230 and the second chassis sidewall 234.

In some implementations, some of the sidewalls provided in the chassis 228 can include guides for receiving the one or more sleds. The guides can facilitate sliding the one or more sleds in and out of the chassis 228. For example, the first chassis sidewall 230 and the second chassis sidewall 234 can include guides. In another example, the first chassis sidewall 230, the second chassis sidewall 234, and the separator sidewall 236 can include guides. Analogizing with a drawer, when coupled with the chassis 228, the one or more sleds can slide in two opposite directions—a slide-open direction or a slide-close direction. As depicted in FIG. 2, the first sled 201*a* is not yet received by the chassis 228, and the second sled 201*b* is fully received within the chassis 228. When a sled is fully received, such that the sled can no longer slide in the slide-close direction, the sled is placed in the closed position. From the closed position, the sled can slide in a slide-open direction to vacate the closed position. In some implementations, the chassis 228 includes swing latches 301*a*, 301*b* coupled to one or more of the sidewalls to lock the one or more sleds in the closed position.

Figure 3:
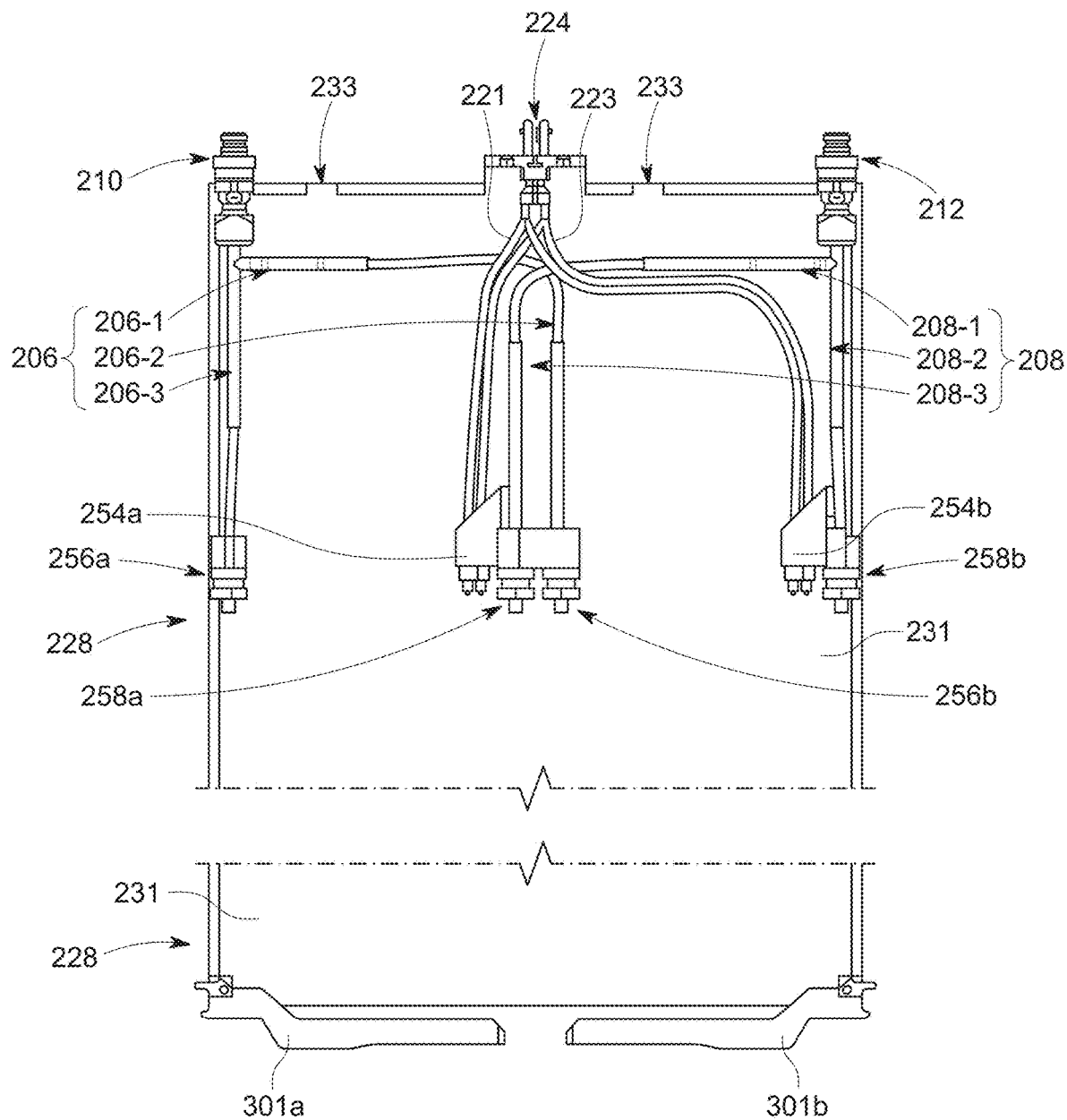
FIG. 3 is a top plan view of a chassis of the multi-node computing system of FIG. 2, according to certain aspects of the present disclosure.

FIG. 3 is a top plan view of the chassis 228, according to certain aspects of the present disclosure. The following description takes advantage of the views in FIGS. 2 and 3. The chassis 228 houses a water circulation network. The water circulation network includes a chassis cold water pipe 206, a chassis hot water pipe 208, one or more chassis cold water docking connectors (e.g., a first-node chassis cold water docking connector 256*a*, a second-node chassis cold water docking connector 256*b*, a chassis cold water inlet docking connector 210), one or more chassis hot water docking connectors (e.g., a first-node chassis hot water docking connector 258*a*, a second-node chassis hot water docking connector 258*b*, a chassis hot water inlet docking connector 212). The chassis cold water pipe 206 and the one or more chassis cold water docking connectors are part of a cold water distribution network of the water circulation network. The chassis hot water pipe 208 and the one or more chassis hot water docking connectors are part of a hot water collection network of the water circulation network.

In some implementations, the one or more chassis cold water docking connectors and the one or more chassis hot water docking connectors are quick docking connectors. In some implementations, a first quick docking connector can include a valve that allows liquid flow when the first quick docking connector directly engages with a second quick docking connector and prevents liquid flow when the first quick docking connector in not engaged with the second quick docking connector. In some implementations, the first quick docking connector includes a manual valve that can be turned ON or turned OFF to allow or prevent liquid flow through the first quick docking connector. In some implementations, the manual valve is a ball valve controlled using a tap provided on the quick docking connector. In some implementations, two connectors are engaged by screwing one into another, securing a fastener (e.g., a nut) coupled to threads on the connector, plugging one connector into another until both are latched to each other, etc.

In some implementations, the chassis cold water pipe 206 includes multiple sections (see, e.g., chassis cold water pipe sections 206-1, 206-2, and 206-3 of FIG. 3) and the chassis hot water pipe 208 includes multiple sections (see, e.g., chassis hot water pipe sections 208-1, 208-2, and 208-3 of FIG. 3). Each of the chassis cold water pipe 206 and the chassis hot water pipe 208 can be arranged in U-shapes. That is, the chassis cold water pipe sections 206-1, 206-2, and 206-3 can be arranged in a U-shape, and/or the chassis hot water pipe sections 208-1, 208-2, and 208-3 can be arranged in a U-shape. In a computing system having three or more nodes, additional sections can be added to the chassis cold water pipe 206 and the chassis hot water pipe 208 to accommodate the other nodes. That is, additional L shapes can be fashioned to extend the U-shape, e.g., to extend the U-shape to a W-shape for a three-node system.

In some implementations, the chassis cold water pipe section 206-1 is routed proximate to the first chassis sidewall 230. The chassis cold water pipe section 206-1 is terminated with the first-node chassis cold water docking connector 256*a*. In some implementations, the first-node chassis cold water docking connector 256*a* can be attached to the first chassis sidewall 230 and/or the chassis floor 231, thus rendering the position of the first-node chassis cold water docking connector 256*a* stationary. Similarly, each of the one or more chassis cold water docking connectors or the one or more chassis hot water docking connectors can be rendered stationary by attaching or fixing to the chassis 228.

In some implementations, the chassis hot water inlet docking connector 212 and the chassis cold water inlet docking connector 210 are stationary, while one or more of the first-node chassis cold water docking connector 256*a*, the second-node chassis cold water docking connector 256*b*, the first-node chassis hot water docking connector 258*a*, or the second-node chassis hot water docking connector 258*b* are movable. Some sections of the chassis cold water pipe 206 or the chassis hot water pipe 208 are movable to facilitate sliding the one or more sleds underneath the chassis cold water pipe 206 or the chassis hot water pipe 208.

The chassis 228 further includes a bus bar clip 224. The bus bar clip 224 can be connected to an external power source, allowing power to flow through chassis power routing cables 221, 223 to provide power to the one or more sleds. The chassis power routing cables 221, 223, along with any chassis power connector (e.g., the bus bar clip 224, a first-node chassis power connector 254*a* and a second-node chassis power connector 254*b*), forms a power distribution network of the computing system 200. In some implementations, the bus bar clip 224 is attached to the chassis 228 and remains stationary while the first-node chassis power connector 254*a* and/or the second-node chassis power connector 254*b* is movable.

In some implementations, the first-node chassis power connector 254*a* and/or the second-node chassis power connector 254*b* is attached to or fixed to the one or more chassis hot water docking connectors or the one or more chassis cold water docking connectors. For example, the first-node chassis power connector 254*a* is attached to the first-node chassis hot water docking connector 258*a*, and the second-node chassis power connector 254*b* is attached to the second-node chassis hot water docking connector 258*b*. The first-node chassis power connector 254*a* and the second-node chassis power connector 254*b* can be attached such that there is some clearance to allow the one or more sleds to slide underneath and be situated between the chassis floor 231 and one of the first-node chassis power connector 254a or the second-node chassis power connector 254b.

Figure 4:
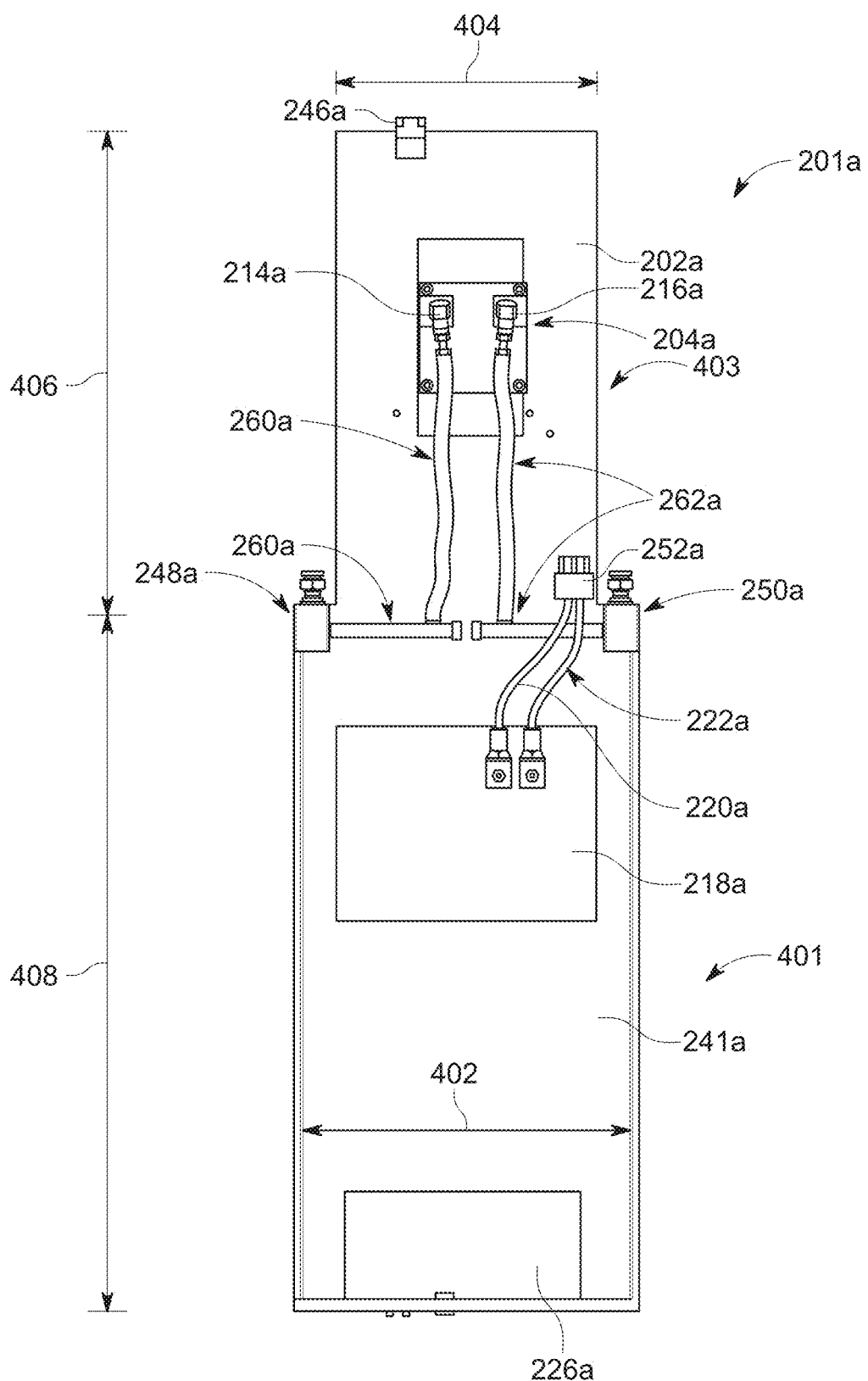
FIG. 4 is a top plan view of a sled for the computing system of FIG. 2, according to certain aspects of the present disclosure.

FIG. 4 is a top plan view of the first sled 201a, according to certain aspects of the present disclosure. The following description takes advantage of the views in FIGS. 2 and 4. The first sled 201a can be similar to or identical to the second sled 201b (FIG. 2). The first sled 201a and the second sled 201b include sled floors 241a, 241b, respectively. The first sled 201a and the second sled 201b include circuit boards (e.g., a first-node circuit board 202a, a second-node circuit board 202b, power distribution boards 218a, 218b, I/O boards 226a, 226b, etc.). The first sled 201a and the second sled 201b have separate power distribution boards 218a, 218b and separate I/O boards 226a, 226b when compared to FIG. 1. Each of the different boards can be secured to the sled floors 241a, 241b.

Because the boards are not shared between the first sled 201a and the second sled 201b, operations of the first sled 201a can be decoupled from operations of the second sled 201b. In an example where the first sled 201a corresponds to a first computing node and the second sled 201b corresponds to a second computing node, maintenance and repair can be performed on the first computing node without disturbing operations of the second computing node.

The first sled 201a and the second sled 201b include sled panels 238a, 238b. The sled panels 238a, 238b allow access to ports provided on the I/O boards 226a, 226b, respectively. The sled panels 238a, 238b can also include vent holes for allowing airflow through the first sled 201a and the second sled 201b.

Sled power connectors (e.g., a first-node sled power connector 252a and a second-node sled power connector 252b) are provided for interfacing with chassis power connectors (i.e., the first-node chassis power connector 254a and a second-node chassis power connector 254b, respectively). As shown in FIG. 2, when the second sled 201b is in the closed position, the second-node sled power connector 252b is connected to the second-node chassis power connector 254b. Power delivered via the chassis power connectors to the sled power connectors is conducted via sled power routing cables 220a, 222a, 220b, 222b to the power distribution boards 218a, 218b. In some implementations, any one or all of the sled power connectors (e.g., the first-node sled power connector 252a or the second-node sled power connector 252b) are stationary and attached to the sled floor 241a, 241b. In some implementations, none of the sled power connectors are stationary and can be movable to adjust to specific positions of the chassis power connectors.

Sled cold water pipes 260a, 260b are coupled to cold plates 204a, 204b at cold plate cold water connectors 214a, 214b. Similarly, sled hot water pipes 262a, 262b are coupled to the cold plates 204a, 204b at cold plate hot water connectors 216a, 216b. The cold plates 204a, 204b act as bridges allowing liquid from the sled cold water pipes 260a, 260b to flow to the sled hot water pipes 262a, 262b.

Sled cold water docking connectors 248a, 248b terminate ends of the sled cold water pipes 260a, 260b to allow coupling the sled cold water pipes 260a, 260b to the chassis cold water pipe 206. The sled cold water docking connectors 248a, 248b interface with the chassis cold water docking connectors (i.e., the first-node chassis cold water docking connector 256a and the second-node chassis cold water docking connector 256b). Similarly, sled hot water docking connectors 250a, 250b terminate ends of the sled hot water pipes 262a, 262b to allow coupling the sled hot water pipes 262a, 262b to the chassis hot water pipe 208. The sled hot water docking connectors 250a, 250b interface with the chassis hot water docking connectors (i.e., the first-node chassis hot water docking connector 258a and the second-node chassis hot water docking connector 258b). Any of the sled cold water docking connectors 248a, 248b or the sled hot water docking connectors 250a, 250b can be stationary or movable.

In some implementations, the first sled 201a and/or the second sled 201b includes one or more sled sidewalls. For example, the first sled 201a can include one or more lower sled sidewalls 240a, 242a. Any of the sled cold water docking connector 248a or the sled hot water docking connector 250a can be made stationary by attachment to the sled floor 241a and/or the one or more lower sled sidewalls 240a, 242a. Similarly, FIG. 2 provides a lower sled sidewall 240b for the second sled 201b.

The one or more sled sidewalls may include one or more upper sled sidewalls 244a, 246a. The one or more upper sled sidewalls 244a, 246a can be patterned to allow routing of pipes (e.g., the cold water pipe 206 and the hot water pipe 208) and/or power cables (e.g., the chassis power routing cables 221, 223) above the first-node circuit board 202a.

In some implementations, the one or more upper sled sidewalls 244a, 246a are provided on an upper portion 403 of the first sled 201a, and the one or more lower sled sidewalls 240a, 242a are provided on a lower portion 401 of the first sled 201a. The upper portion 403 and the lower portion 401 can have different aspect ratios. For example, the upper portion 403 can have a length 406 and a width 404, and the lower portion 401 can have a length 408 and a width 402. The width 402 can be greater than the width 404. In some implementations, the difference between the width 402 and the width 404 is about the size of two sled cold water docking connectors 248a, the size of two sled hot water docking connectors 250a, or the size of the sled cold water docking connector 248a and the sled hot water docking connector 250a.

Figure 5A:
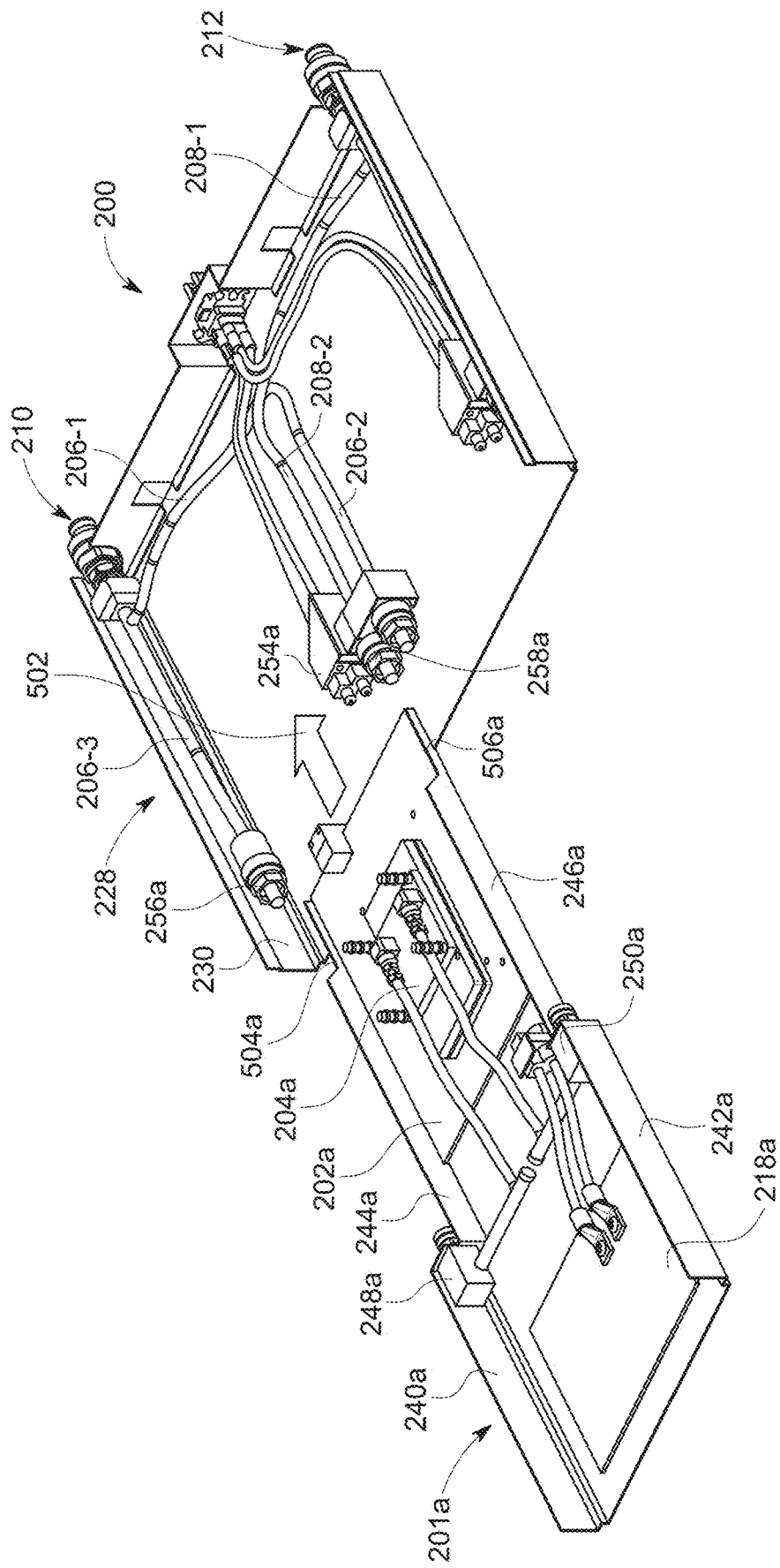
FIG. 5A is a perspective view showing installing the sled of FIG. 4 to the chassis of FIG. 3.

FIG. 5A is a perspective view showing installing the first sled 201a to the chassis 228. The slide-close direction is indicated by arrow 502. Portions 504a and 506a indicate portions of the upper sled sidewalls 244a, 246a that allow routing of pipes and/or power cables. When sliding the first sled 201a in the slide-close direction, the upper sled sidewall 246a will be placed between the first-node chassis power connector 254a and the first-node chassis hot water docking connector 258a. That is, the first-node chassis power connector 254a will overhang the first sled 201 while the first-node chassis hot water docking connector 258a will remain outside the first sled 201. Analogously, the first-node chassis cold water docking connector 256a will remain outside the first sled 201. That is, chassis power connectors can overhang the sleds while chassis water docking connectors remain outside the sled.

Figure 5B:
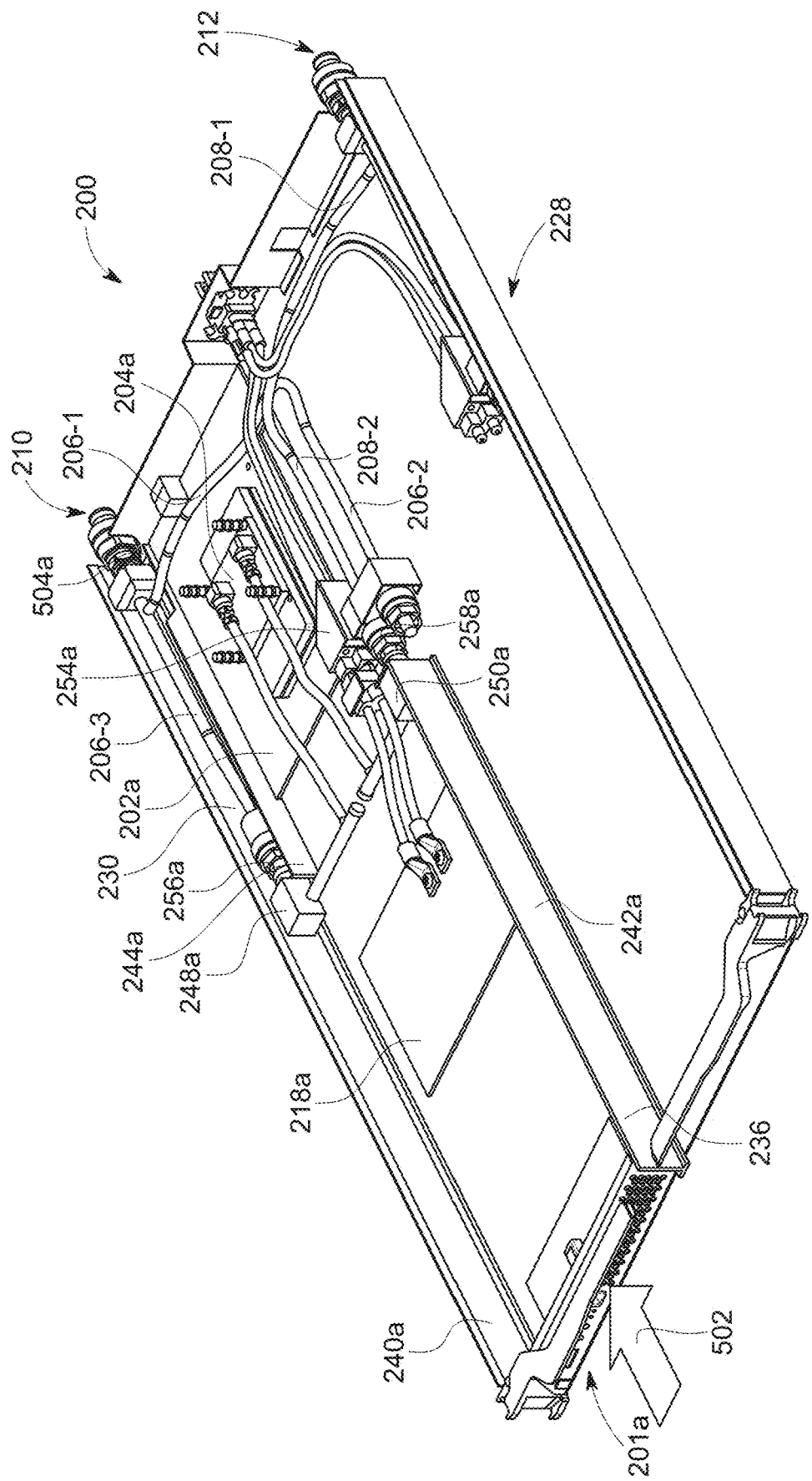
FIG. 5B is a perspective view showing the sled of FIG. 4 installed in the chassis of FIG. 3, according to certain aspects of the present disclosure.
Figure 6:
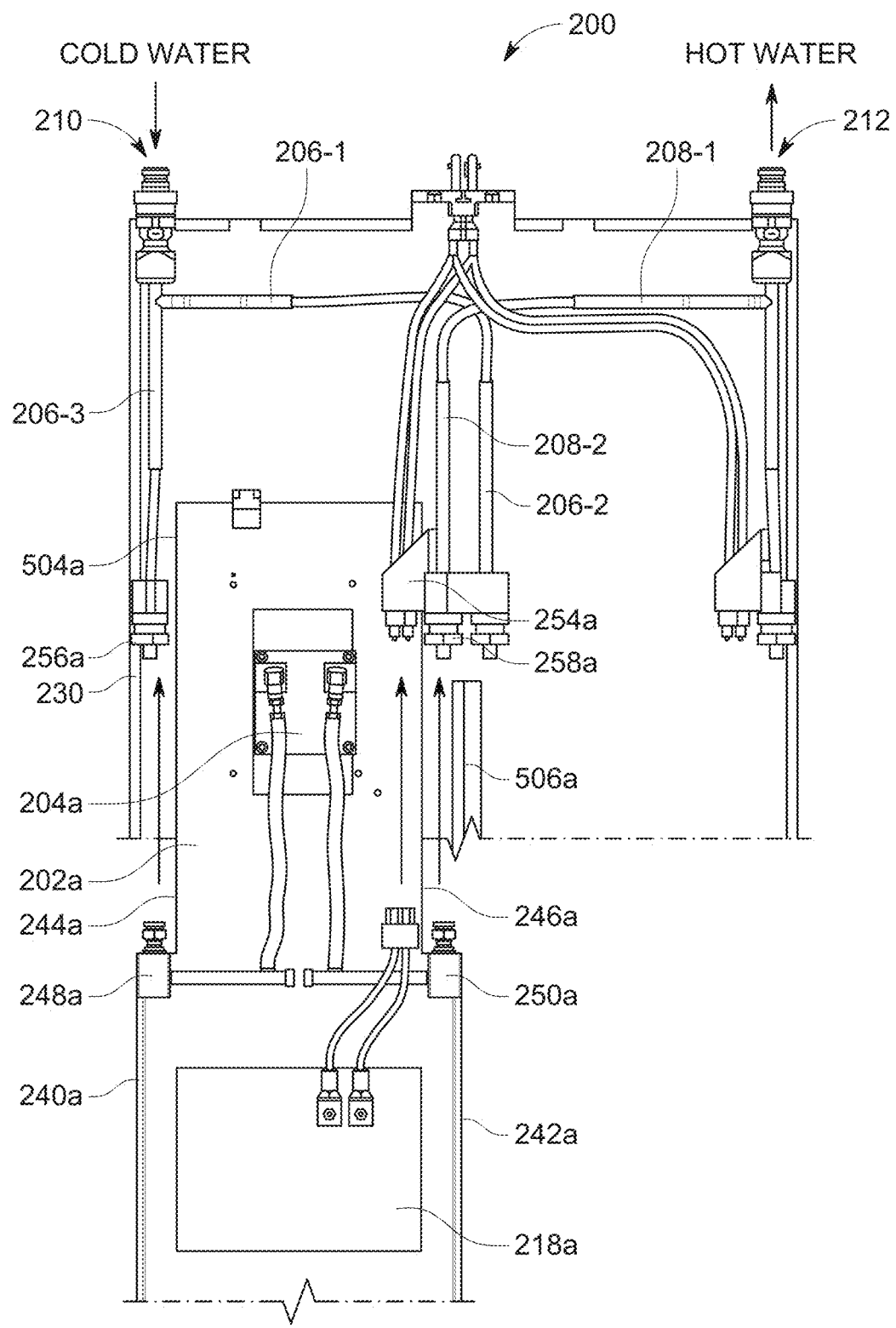
FIG. 6 is a top plan view of FIG. 5A.

FIG. 5B is a perspective view showing the first sled 201a installed in the chassis 228, according to certain aspects of the present disclosure. The different widths 404 and 402 (FIG. 4) between the upper portion 403 (FIG. 4) and the lower portion 401 (FIG. 4), respectively, provide certain features when the first sled 201a is placed in the chassis 228 in the closed position. As shown in FIG. 5B, when installed in the chassis 228, the chassis cold water pipe section 206-3 is routed in a spacing between the first chassis sidewall 230 and the upper sled sidewall 244a. The first-node chassis cold water docking connector 256a is also positioned within the spacing to connect to the sled cold water docking connector 248a. The lower sled sidewalls 240a, 242a, on the other hand, make contact with the first chassis sidewall 230 and the separator sidewall 236. The length of the separator sidewall 236 can be about the length 408 of the lower portion 401 of the first sled 201a. FIG. 6 is a top plan view of FIG. 5A, showing power and water connections between the first sled 201a and the chassis 228.

Figure 7A:
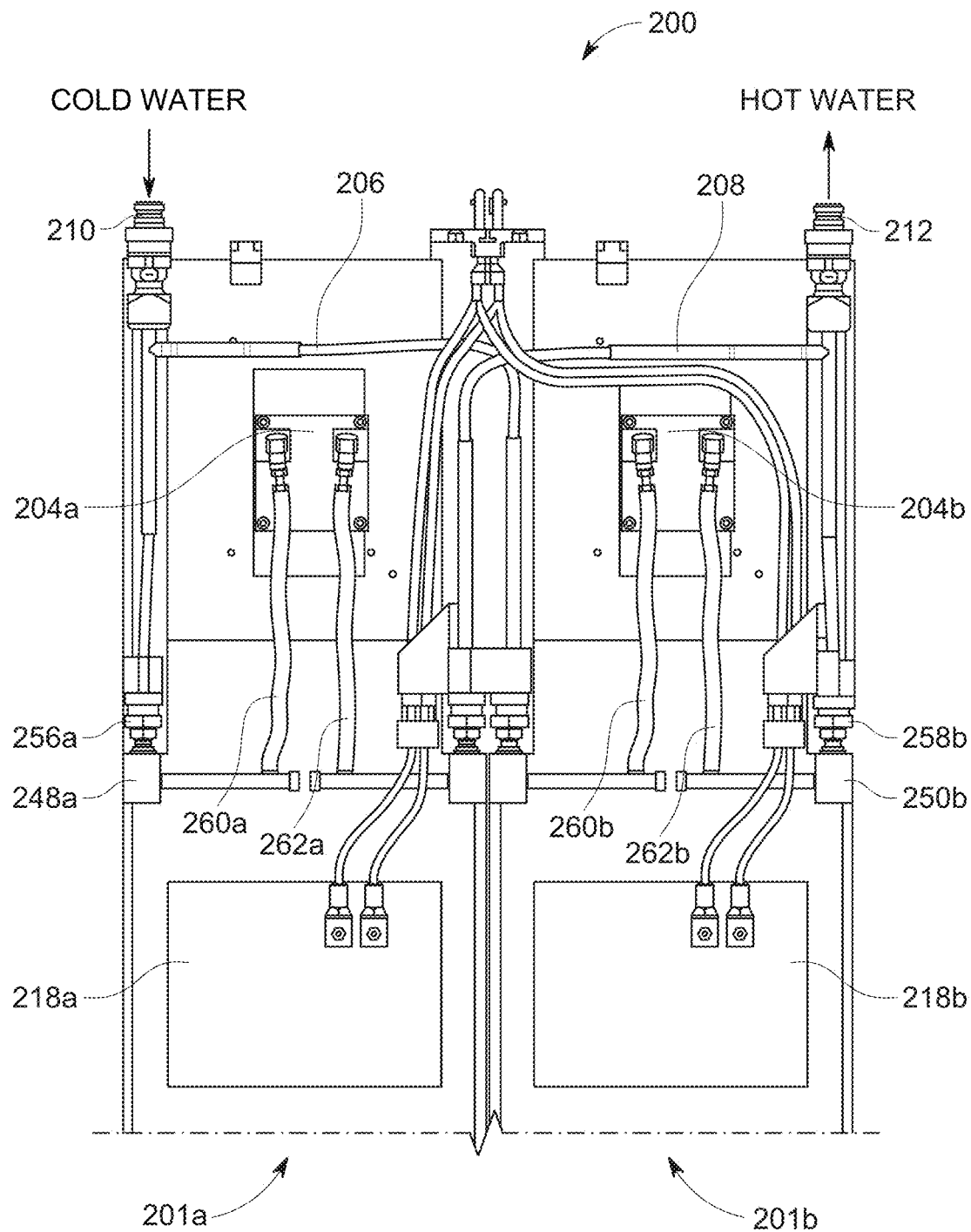
FIG. 7A is a top plan view of a multi-node computing system with two sleds installed in the chassis of FIG. 3, according to certain aspects of the present disclosure.

FIG. 7A is a top plan view of the computing system 200 with two sleds (the first sled 201a and the second sled 201b) installed in the chassis 228 (FIG. 2), according to certain aspects of the present disclosure. In FIG. 7A, cold water enters via the chassis cold water inlet docking connector 210 and hot water exits via the chassis hot water inlet docking connector 212.

Figure 7B:
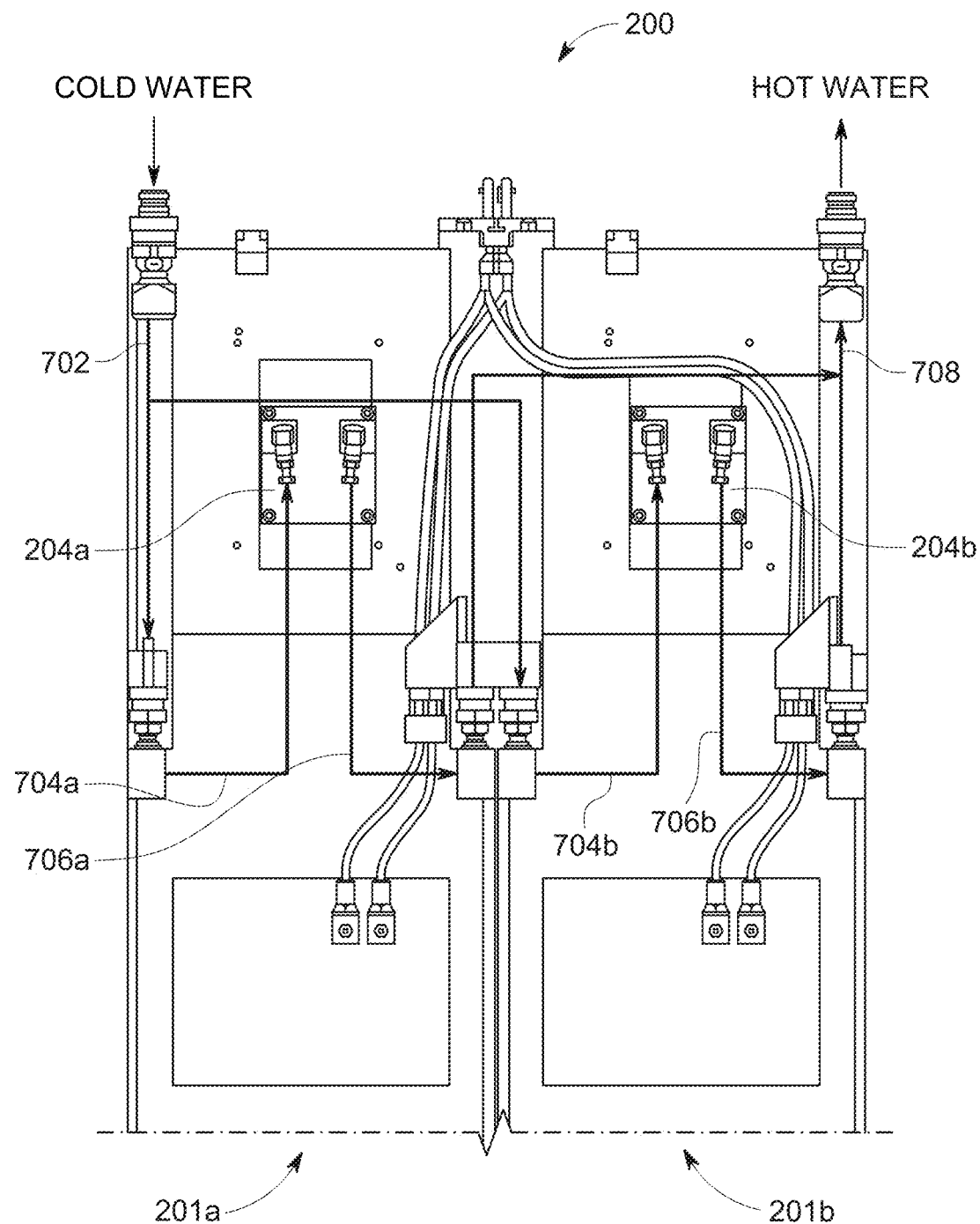
FIG. 7B illustrates fluid flow in the multi-node computing system of FIG. 7A.

FIG. 7B illustrates fluid flow in the computing system 200. Cold water flows in parallel to both the first sled 201a and the second sled 201b as indicated by arrow 702. The received cold water is routed to the cold plates 204a, 204b as indicated by arrows 704a, 704b, respectively. The cold water absorbs heat while passing through the cold plates 204a, 204b to become "hot water." Hot water exits the cold plates 204a, 204b as indicated by arrows 706a, 706b, respectively. The hot water further exits the first sled 201a and the second sled 201b as indicated by arrow 708 and flows out of the computing system 200.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
a chassis;
a water circulation network coupled to the chassis, the water circulation network including a cold water distribution network and a hot water collection network;
a power distribution network coupled to the chassis; and
one or more sleds removably coupled to the chassis, each sled of the one or more sleds including a corresponding cold plate, each sled being configured to
slide along the chassis in two slide directions, the two slide directions including a slide-close direction to reach a closed position and a slide-open direction to vacate the closed position,
bridge the hot water collection network and the cold water distribution network via the corresponding cold plate when at the closed position, and
couple to the power distribution network when at the closed position.

2. The computing system of claim 1, wherein each sled of the one or more sleds houses a computing node.

3. The computing system of claim 1, wherein a first sled of the one or more sleds includes a first cold plate and a first power distribution board, and when the first sled is at the closed position
(i) the first cold plate is coupled to the water circulation network to bridge the cold water distribution network and the hot water collection network at the first cold plate; and
(ii) the first power distribution board is coupled to the power distribution network.

4. The computing system of claim 3, wherein a second sled of the one or more sleds includes a second cold plate and a second power distribution board, and when the second sled is at the closed position
(iii) the second cold plate is coupled to the water circulation network to bridge the cold water distribution network and the hot water collection network at the second cold plate; and
(iv) the second power distribution board is coupled to the power distribution network.

5. The computing system of claim 3, wherein the first sled includes a first sled floor having multiple portions that include an upper first sled floor portion and a lower first sled floor portion, a width of the upper first sled floor portion being less than a width of the lower first sled floor portion.

6. The computing system of claim 5, wherein the first power distribution board is coupled to the lower first sled floor portion and the first cold plate is coupled to the upper first sled floor portion.

7. The computing system of claim 1, wherein each sled of the one or more sleds further includes a sled cold water pipe network and a sled hot water pipe network, a first end of the sled cold water pipe being directly coupled to the corresponding cold plate and a second end of the sled cold water pipe being coupled to the cold water distribution network, a first end of the sled hot water pipe being directly coupled to the corresponding cold plate and a second end of the sled hot water pipe being coupled to the hot water collection network.

8. The computing system of claim 7, wherein each sled of the one or more sleds further includes a sled power routing cable and a power distribution board, the power distribution board being coupled to the sled power routing cable, and when in the closed position, the sled power routing cable is coupled to the power distribution network.

9. The computing system of claim 1, wherein the one or more sleds includes at least a first sled and a second sled, electronic components of the first sled being communicatively coupled to electronic components of the second sled when both the first and second sleds are in the closed position.

10. The computing system of claim 1, wherein the one or more sleds is at least two sleds, the power distribution network being routed in spaces between two adjacent sleds of the at least two sleds.

11. The computing system of claim 1, wherein the one or more sleds is at least two sleds, the cold water distribution network including multiple chassis cold water pipe sections, at least one of the chassis cold water pipe sections being routed in a space between two adjacent sleds of the at least two sleds.

12. The computing system of claim 1, wherein the cold water distribution network includes multiple chassis cold water pipe sections, at least one of the chassis cold water pipe sections being routed in a space between a first sidewall of the chassis and the one or more sleds.

13. The computing system of claim 12, wherein the hot water collection network includes multiple chassis hot water pipe sections, at least one of the chassis hot water pipe sections being routed in a space between a second sidewall of the chassis and the one or more sleds.

14. A method for coupling cold plates of a computing system including at least two sleds to a water circulation network of the computing system, the method comprising:
sliding a first sled of the at least two sleds along a chassis of the computing system in a slide-close direction to place the first sled in a closed position;
attaching a first cold plate of the first sled to the water circulation network such that the first cold plate bridges a cold water distribution network of the water circulation network and a hot water collection network of the water circulation network; and
attaching a first power distribution board of the first sled to a power distribution network of the computing system.

15. The method of claim 14, wherein the attaching the first cold plate of the first sled to the water circulation network comprises:
securing least one fastener.

16. The method of claim 14, further comprising:
sliding a second sled of the at least two sleds along the chassis of the computing system in the slide-close direction to place the second sled in the closed position, the second sled being located proximate to the first sled;
attaching a second cold plate of the second sled to the water circulation network such that the second cold plate bridges the cold water distribution network of the water circulation network and the hot water collection network of the water circulation network at the second cold plate; and
attaching a second power distribution board of the second sled to the power distribution network of the computing system.

17. The method of claim 16, further comprising:
electrically coupling electrical components of the first sled to electrical components of the second sled via a cable.

18. A method for decoupling cold plates of a computing system including at least two sleds from a water circulation network of the computing system, the method comprising:
detaching a first cold plate of a first sled of the at least two sleds from the water circulation network to remove a bridge formed between a cold water distribution network of the water circulation network and a hot water collection network of the water circulation network at the location of the first cold plate;
detaching a first power distribution board of the first sled from a power distribution network of the computing system; and
sliding the first sled along a chassis of the computing system in a slide-open direction to displace the first sled from a closed position.

19. The method of claim 18, wherein the detaching the first cold plate of a first sled of the at least two sleds from the water circulation network comprises:
loosening at least one fastener.

20. The method of claim 18, further comprising:
detaching a cable connecting electrical components of the first sled to electrical components of a second sled prior to sliding the first sled along the chassis of the computing system in the slide-open direction.

* * * * *